United States Patent
Zeng (10) Patent No.: US 9,124,233 B2
(45) Date of Patent: Sep. 1, 2015

(54) AUDIO EQUALIZER AND METHODS FOR USE THEREWITH

(75) Inventor: Hong Zeng, North York (CA)

(73) Assignee: VIXS Systems, INC, Toronto, Ontario (CA)

( * ) Notice: Subject to any disclaimer, the term of this patent is extended or adjusted under 35 U.S.C. 154(b) by 629 days.

(21) Appl. No.: 12/868,617

(22) Filed: Aug. 25, 2010

(65) Prior Publication Data

US 2012/0051559 A1    Mar. 1, 2012

(51) Int. Cl.
*H03G 5/00*      (2006.01)
*H03G 9/02*      (2006.01)
*H03G 9/00*      (2006.01)

(52) U.S. Cl.
CPC ............... *H03G 9/025* (2013.01); *H03G 9/005* (2013.01)

(58) Field of Classification Search
CPC ...................... G11B 2220/20; G11B 2220/216; G11B 27/034; G11B 27/329; G11B 27/34; H04H 20/30; H04H 20/57; H04H 20/95; H04H 40/27

USPC ............ 381/56–58, 17–23, 102–104, 66, 98; 700/94; 379/406; 704/500, 503, 504

See application file for complete search history.

(56) References Cited

U.S. PATENT DOCUMENTS

| | | | | |
|---|---|---|---|---|
| 5,669,011 | A * | 9/1997 | Alpert et al. ..................... | 712/23 |
| 6,011,853 | A * | 1/2000 | Koski et al. ..................... | 381/56 |
| 2004/0213339 | A1* | 10/2004 | Smee et al. ................... | 375/232 |
| 2006/0062405 | A1* | 3/2006 | McKee Cooper ............. | 381/103 |
| 2009/0238380 | A1* | 9/2009 | Brannmark et al. ............ | 381/98 |
| 2011/0029111 | A1* | 2/2011 | Sabin et al. ..................... | 700/94 |

* cited by examiner

*Primary Examiner* — Lun-See Lao
(74) *Attorney, Agent, or Firm* — Garlick & Markison; Bruce E. Stuckman (57) ABSTRACT

An audio equalizer includes an equalization processor that operates in conjunction with a transformed-based audio decoder that generates a decoded audio signal from an encoded audio signal. The equalization processor receives an equalization input signal, generates a plurality of response coefficients in response to the equalization input and applies the response coefficients to partially decoded data of the transformed-based audio decoder.

18 Claims, 7 Drawing Sheets

AUDIO EQUALIZER AND METHODS FOR USE THEREWITH

CROSS REFERENCE TO RELATED PATENTS

Not Applicable

TECHNICAL FIELD OF THE INVENTION

The present invention relates to security in processing devices.

DESCRIPTION OF RELATED ART

Many audio and video systems include an audio equalizer that allows the system or the user to adjust the frequency response of the system to a user's tastes, to the particular environment, to the type of music that is being reproduced, etc. The audio equalizer is traditionally constructed with a series of time-domain filters, either embodied in analog circuits or digital filters. An example of such an equalizer is present in conjunction with US Publication No. US2004/0213339, entitled, "Equalizer". In an audio player with a typical audio decoder that plays encoded digital audio source material, an equalizer could double the CPU usage of an audio player. In many circumstances, the implementation of an equalizer may be too expensive or otherwise be impractical for many real-time audio/video systems in the consumer market.

Further limitations and disadvantages of conventional and traditional approaches will become apparent to one of ordinary skill in the art through comparison of such systems with the present invention.

DETAILED DESCRIPTION OF THE INVENTION INCLUDING THE PRESENTLY PREFERRED EMBODIMENTS

Figure 1:
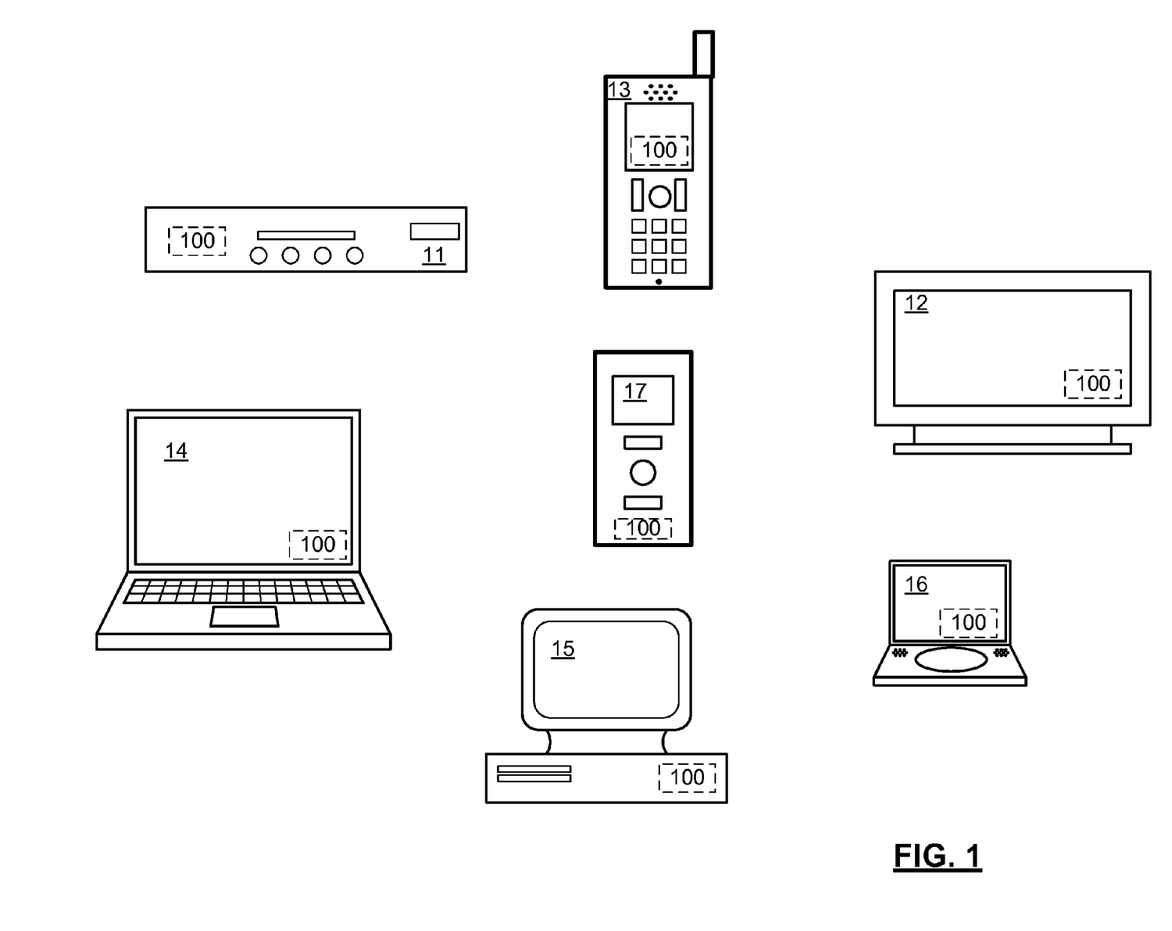
FIG. 1 presents a pictorial representation of example devices 11-17 that can include an audio equalizer 100 in accordance with an embodiment of the present invention.

FIG. 1 presents a pictorial representation of example devices 11-17 that can include an audio equalizer 100 in accordance with an embodiment of the present invention. In particular, these example devices include digital video recorder/set top box 11, television or monitor 12, wireless telephony device 13, computers 14 and 15, personal video player 16, personal audio player 17 or other devices that include an audio equalizer.

Audio equalizer 100 operates in conjunction with a transformed-based audio decoder included in the host device. The audio equalizer 100 generates equalizer response coefficients that are applied directly to audio data in the frequency domain, before the audio data is fully decoded. This approach avoids the use of complicated time-domain digital filters, yet is equivalent in performance to a time-domain equalizer embodied with an FIR filter of order as high as the size of frame length (1024 for AAC). In short, the audio equalizer 100 can achieve high quality equalizer effects, adapting to any desired equalizer response. In addition, since the transform-based audio decoder is already working in frequency domain, the audio equalizer 100 needs not re-perform the steps of transform and reverse transform, reducing the computational effort required to perform the equalization. In operation, the audio equalizer 100 can use as little as 0.1%~0.2% of the processing required by an time-domain equalizer.

While audio equalizer 100 is shown as being integrated in each of the devices 11-17, in an alternative embodiment of the present invention, audio equalizer 100 can be coupled to one or more of these host devices via a host interface. In particular, audio equalizer 100 can take on any one of a number of form factors such as a PC card, memory card, personal computer memory card international association (PCMCIA) card, universal serial bus (USB) dongle or other device that is coupleable to one or more host devices via an Ethernet connection, a memory card interface, USB connection, Firewire (IEEE 1394) connection, small computer system interface (SCSI), PCMCIA interface, or other interface either standard or proprietary or that is incorporated into the device 11-17.

Audio equalizer 100 will be described in greater detail in conjunction with FIGS. 2-10, including several optional functions and features.

Figure 2:
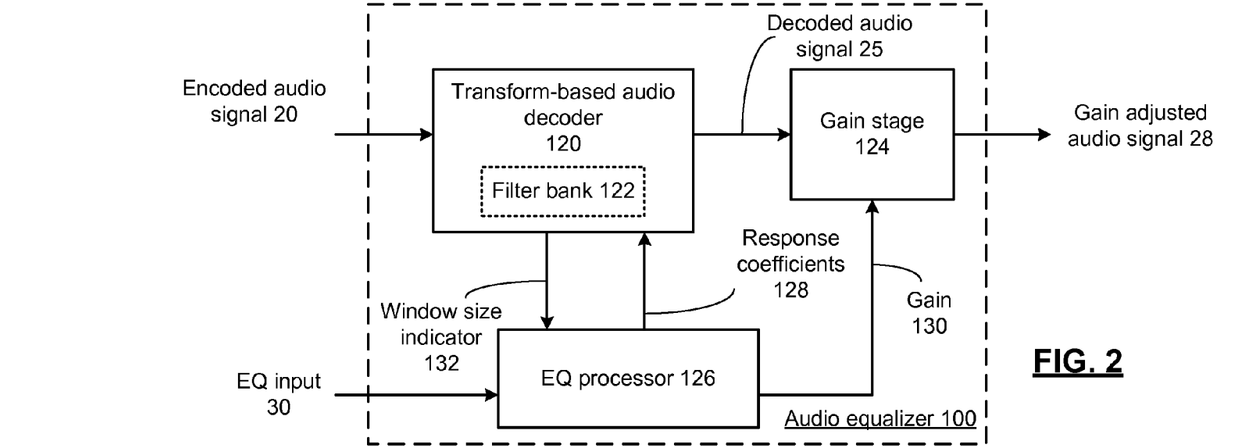
FIG. 2 presents a block diagram representation of an audio equalizer 100 in accordance with an embodiment of the present invention.

FIG. 2 presents a block diagram representation of an audio equalizer 100 in accordance with an embodiment of the present invention. Audio equalizer 100 includes an equalization processor 126 that operates in conjunction with a transformed-based audio decoder 120 that generates a decoded audio signal 25, such as pulse code modulated (PCM) data, from an encoded audio signal 20. For instance, the transform-based audio decoder 120 can be a decoder that decodes an encoded audio signal that is formatted in accordance with an audio coding method such as Windows Media Architecture (WMA), Motion Picture Expert Group audio layer 3 (MP3), Advanced Audio Coding (AAC), Dolby Digital (AC3), or other audio coding methodology that operates, at least partially in the frequency domain. In particular, typical transform-based audio decoders operate based on inverse quantization and spectral processing that produce partially decoded data in the frequency domain. A synthesis filter bank 122 is included to produce an audio signal, such as decoded audio signal 25, in the time domain.

In operation, equalization processor 126 receives an equalization input signal 30 from a user or from in a preloaded data table or other memory, not specifically shown. For instance, the equalization input 30 can include an equalization curve that represents the desired equalization, such as a particular equalization gain as a function of frequency. Equalization processor 126 generates a plurality of response coefficients 128 that reflect this desired equalization. Equalization processor 126 operates in conjunction with transform-based audio decoder 120 to apply the response coefficients 128 to partially decoded data. In an embodiment of the present invention, the response coefficients are multiplied by partially decoded frequency domain data, prior to the application of a filter, such as filter bank 122. This operates to adjust the partially decoded data by the desired equalization, directly in the frequency domain.

In an embodiment of the present invention, the response coefficients 128 are values in the range of 0 to 1.0 that are generated in response to equalization input 30 to represent the desired equalization gain at each frequency. Since the equalizer coefficients are values less than 1.0, equalization processor 126 generates a gain 130 applied to gain stage 124 to adjust the decoded audio signal 25 to produce a gain adjusted audio signal 28 at a similar sound level. It should be noted that, in a further embodiment, the response coefficients 128 can themselves by adjusted by the calculated gain 130 to produce an output at the appropriate sound level, without the need of gain stage 124.

In an embodiment of the present invention, the transform-based audio decoder 120, gain stage 124 and equalization processor 126 can be implemented using a single processing device or a plurality of processing devices. Such a processing device may be a microprocessor, co-processors, a microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions that are stored in a memory, such as an external memory or an internal memory to each device. In particular, when the equalization processor 126 implements one or more of its functions via a state machine, digital circuitry, and/or logic circuitry, the memory storing the corresponding operational instructions may be embedded within the circuitry comprising the state machine, analog circuitry, digital circuitry, and/or logic circuitry. It should further be noted that while the equalization processor 126 and gain stage 124 are shown as a being separate from the transform-based audio decoder 120, the equalization processor 126 and/or gain stage 124 can be incorporated directly in the transform-based audio decoder 120.

Figure 3:
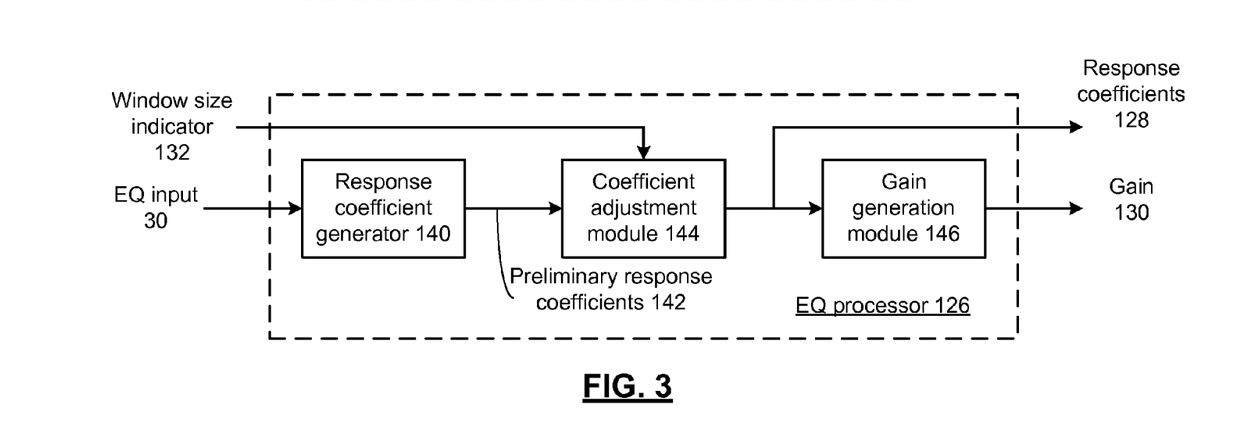
FIG. 3 presents a block diagram representation of a equalization processor 126 in accordance with an embodiment of the present invention.

FIG. 3 presents a block diagram representation of an equalization processor 126 in accordance with an embodiment of the present invention. The equalization processor 126 includes a response coefficient generator 140, a coefficient adjustment module 144 and a gain generation module 146.

The response coefficient generator 140 generates a plurality of preliminary response coefficients 142 based on the equalization input signal 30. In an embodiment of the present invention, the equalization input signal 30 includes a plurality of equalization settings that represent, for example, a plurality of equalization filter gains. For example, a user of a device 11-17 may be presented with a graphical user interface that is implemented in conjunction with that device that allows a user to select gains ($g_1, g_2, \ldots g_{10}$) for filters at 32 Hz, 64 Hz, 128 Hz, 256 Hz, 512 Kz, 1 kHz, 2 kHz, 4 kHz, 8 kHz and 16 kHz, that represent a desired frequency response. In a further example, similar equalization filter gains or other equalization settings can be retrieved from a look-up table or memory of the device 11-17. In this fashion, different equalization settings can be automatically employed based on the source or other parameters of the encoded audio signal, based on parameters of the transform-based audio decoder 120 or other variables. It should be noted that while this example describes a ten octave equalizer, equalization input signals 30 with greater or fewer settings may likewise be employed to represent a desired frequency response.

In response to the equalization filter gains or other equalization settings of the equalization input signal 30, the response coefficient generator 140 generates an equalization curve that corresponds to the desired frequency response. In one example, the response coefficient generator 140 uses interpolation or other curve fitting techniques to generate the equalization curve that fills-in gains at frequencies, intermediate to the filter frequencies, corresponding to the plurality of preliminary response coefficients. In a further example, the equalization input signal 30 includes the equalization curve itself. A further example will be presented in conjunction with FIG. 4.

Figure 4:
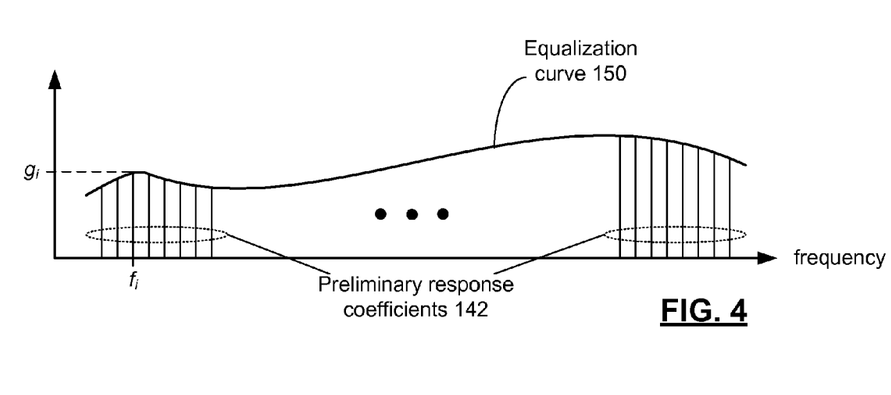
FIG. 4 presents a graphical representation of an equalization curve in accordance with a further embodiment of the present invention.

FIG. 4 presents a graphical representation of an equalization curve in accordance with a further embodiment of the present invention. An equalization curve 150 is shown that is either included in equalization input signal 30 of generated by response coefficient generator 140 in response to the equalization input signal 30. As discussed, the equalization curve 150 represents a desired frequency response of the decoded audio signal 25, such as a 20 Hz-20 kHz frequency response. Response coefficient generator 140 generates a plurality of preliminary response coefficients 142 that correspond to the frequency bins employed in the transform-based audio decoder 120. For example, the preliminary response coefficients 142 can be fit to the response curve. Considering the example of a particular preliminary response coefficient 142 at frequency $f_i$, the gain $g_i$ can be determined from the gain of the equalization curve 150 at that corresponding frequency.

It should be noted that the graph of FIG. 4 is not shown to scale and may, for example, include many more preliminary response coefficients 142 than are represented. For example, a number of preliminary response coefficients 142 can be determined based on the frame/window size of the transform-based audio decoder 120. Transform-based codecs are frame based, and most of them have a fixed frame size and window size. The number of preliminary response coefficients 142 can be 1024 when, for example, the transform-based audio decoder 120 decodes an AAC encoded audio signal 20.

While using a fixed frame size, some codecs employ different transform window sizes. For example, ACC employs two different window sizes of 1024 and 128. To perform the same equalization for an audio stream, the equalization processor 126 needs to generate response coefficients 128 for various window sizes. Returning now to FIG. 3, the equalization processor 126 includes a coefficient adjustment module 144 that generates the response coefficients 128 from the preliminary response coefficients 142, based on a window size indicator 132 received from the transform-based audio decoder 120. This is done by scaling the number of coefficients to the desired window size.

The operation of coefficient adjustment module 144 can be described in the context of the following example where the set of preliminary response coefficients 142 is generated for a window size of 1024 in an AAC stream. The coefficient adjustment module 144 can pass the preliminary response coefficients 142 as the response coefficients 128, when the window size indicator 132 indicates a full window size, such as 1024. The coefficient adjustment module 144 adjusts the preliminary response coefficients 142 to generate response coefficients 128 when the window size indicator 132 indicates a short window of size of 128. An example of such an adjustment by coefficient adjustment module 144 is presented in conjunction with FIG. 5.

Figure 5:
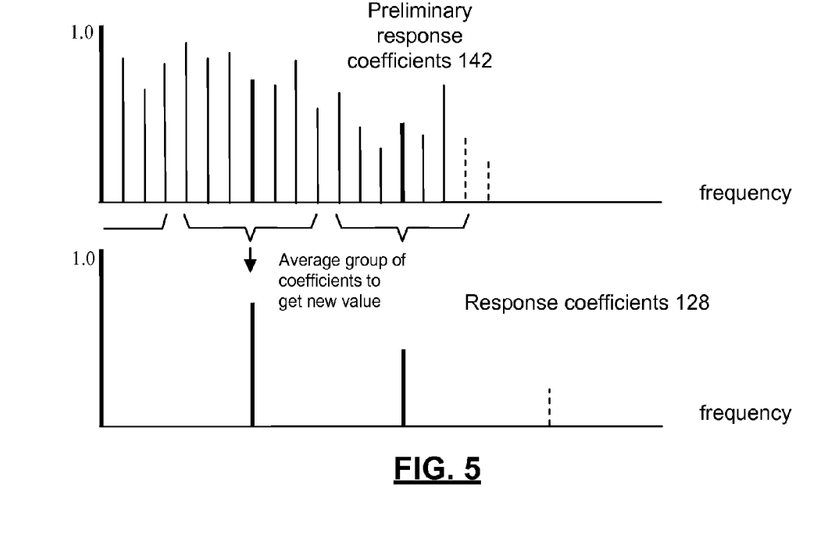
FIG. 5 presents a graphical representation of adjusting preliminary filter coefficients in accordance with an embodiment of the present invention.

FIG. 5 presents a graphical representation of adjusting preliminary filter coefficients in accordance with an embodiment of the present invention. In particular, an example is shown the presents a portion of the preliminary response coefficients 142 for a particular equalization. In this example, coefficient adjustment module 144 adjusts the preliminary response coefficients 142 by generating groups. The individual response coefficients 128 are generated by averaging the preliminary response coefficients 142 in a corresponding group. In this fashion, a set of 1024 preliminary response coefficients 142 can be scaled down to 128, by dividing the 1024 preliminary response coefficients 142 into 128 groups. The response coefficients 128 are aligned in frequency to the center of the corresponding group, with the gain being determined as the average gain from the preliminary response coefficients 142 in that group. While the example above described adjustment from 1024 to a short window size of 128, the same principle can be applied to the conversion between window sizes of different audio types, like AAC and MP3 with window size of 1024 and 576 respectively. It should be further noted that if conversion is from a short window size to a longer window size, instead of taking the average, the coefficient adjustment module 144 can adjust the preliminary response coefficients 142 to interpolate new values for a larger window.

Returning again to FIG. 3, the equalization processor 126 includes a gain generation module 146 that generates the gain signal 130. As discussed in conjunction with FIG. 2, the response coefficients 128 are applied to the partially decoded transform data from the transform-bases audio decoder 120. For example, the value of the data in each frequency bin can be multiplied by the response coefficient 128 at the corresponding frequency. In an embodiment of the present invention, the response coefficients 128 are scaled to values from 0-1.0. In this embodiment, the application in the response coefficients 128 results in a reduction of the over audio signal level. Gain stage 124 is included to adjust the gain of the decoded audio signal 25 to maintain a similar signal level in gain adjusted audio signal 28.

In an embodiment of the present invention, the gain signal 130 is determined by gain generation module 146 based on an averaging of at least a subset of the plurality of response coefficients 128. For example, the gain G can be obtained by computing the average A of the gains $g_i$ of response coefficients 128 in a limited frequency range, such as between 0~3000 Hz, as follows:

$$G = 1/A$$

It should be noted further, in an alternative embodiment, gain 130 can be applied directly to normalize the plurality of response coefficients 128, if possible, avoiding the need to include gain stage 124.

Figure 6:
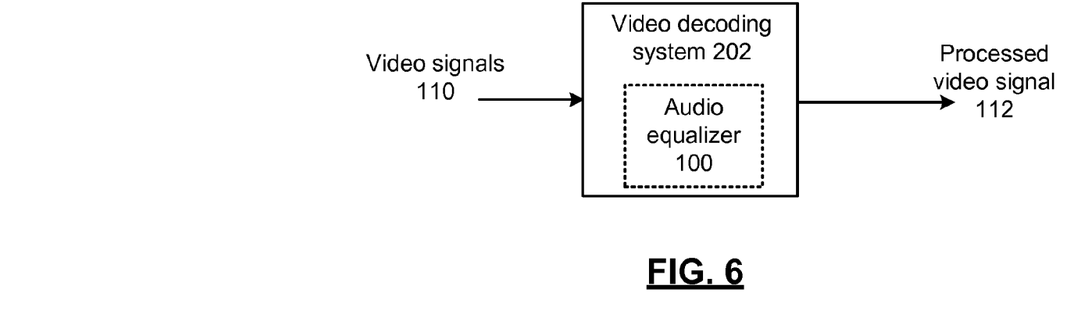
FIG. 6 presents a block diagram representation of a video decoding system 202 in accordance with an embodiment of the present invention.

FIG. 6 presents a block diagram representation of a video decoding system 202 in accordance with an embodiment of the present invention. In particular, the video decoding system 202, operates in accordance with many of the functions and features of the H.264, MPEG-4 Part 10 Advanced Video Coding (AVC), or other digital format such as a Moving Picture Experts Group (MPEG) format (such as MPEG1, MPEG2 or MPEG4), VC-1 (SMPTE standard 421M), Quicktime format, Real Media format, Windows Media Video (WMV), Audio Video Interleave (AVI), or another digital video format, either standard or proprietary or other video format. Decoding system 202 operates to decode video input signals 110, that include encoded audio signal 20 to form a processed video signal 112, that includes or is based on decoded audio signal 25 or gain adjusted audio signal 28. In particular, video encoding system 202 can include audio equalizer 100.

Video signal 110 and/or processed video signal 112 can be interfaced in association with a set-top box, television receiver, personal computer, cable television receiver, satellite broadcast receiver, broadband modem, 3G transceiver, a broadcast satellite system, internet protocol (IP) TV system, the Internet, a digital video disc player, a digital video recorder, or other video device. In an embodiment of the present invention, the video signals 110 and or 112 can include a broadcast video signal, such as a television signal, high definition television signal, enhanced high definition television signal or other broadcast video signal that has been transmitted over a wireless medium, either directly or through one or more satellites or other relay stations or through a cable network, optical network or other transmission network. In addition, the video signal 110 and/or processed video signal 112 can be generated from a stored video file, played back from a recording medium such as a magnetic tape, magnetic disk or optical disk, and can include a streaming video signal that is transmitted over a public or private network such as a local area network, wide area network, metropolitan area network or the Internet.

Figure 7:
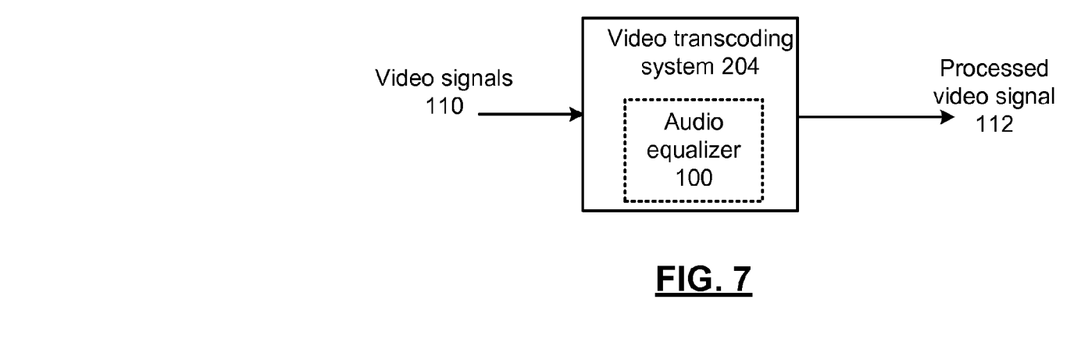
FIG. 7 presents a block diagram representation of a video transcoding system 204 in accordance with an embodiment of the present invention.

FIG. 7 presents a block diagram representation of a video transcoding system 204 in accordance with an embodiment of the present invention. In particular, video transcoding system 204 operates in accordance with many of the functions and features of the H.264, MPEG-4 Part 10 Advanced Video Coding (AVC), or other digital format such as a Moving Picture Experts Group (MPEG) format (such as MPEG1, MPEG2 or MPEG4), VC-1 (SMPTE standard 421M), Quicktime format, Real Media format, Windows Media Video (WMV), Audio Video Interleave (AVI), high definition media interface (HDMI) or another digital video format, either standard or proprietary or other video format. Video transcoding system 204 operates to transcode video input signals 110, that includes encoded audio signal 20 to form a processed video signal 112, that includes or is based on decoded audio signal 25 or gain adjusted audio signal 28. In particular, video transcoding system 204 can include audio equalizer 100.

As used herein, transcoding can include transrating, transcrypting, and/or transcaling the video signal 110 to generate processed video signal 112 in addition to transcoding the video signal 110 from one encoded audio/video format into another encoded audio/video format to form processed video signal 112. Transcoding can specifically include transcoding the audio portion of video signal 110 to a different sample rate, encoding standard or other digital format, stereo to mono, etc.

Figure 8:
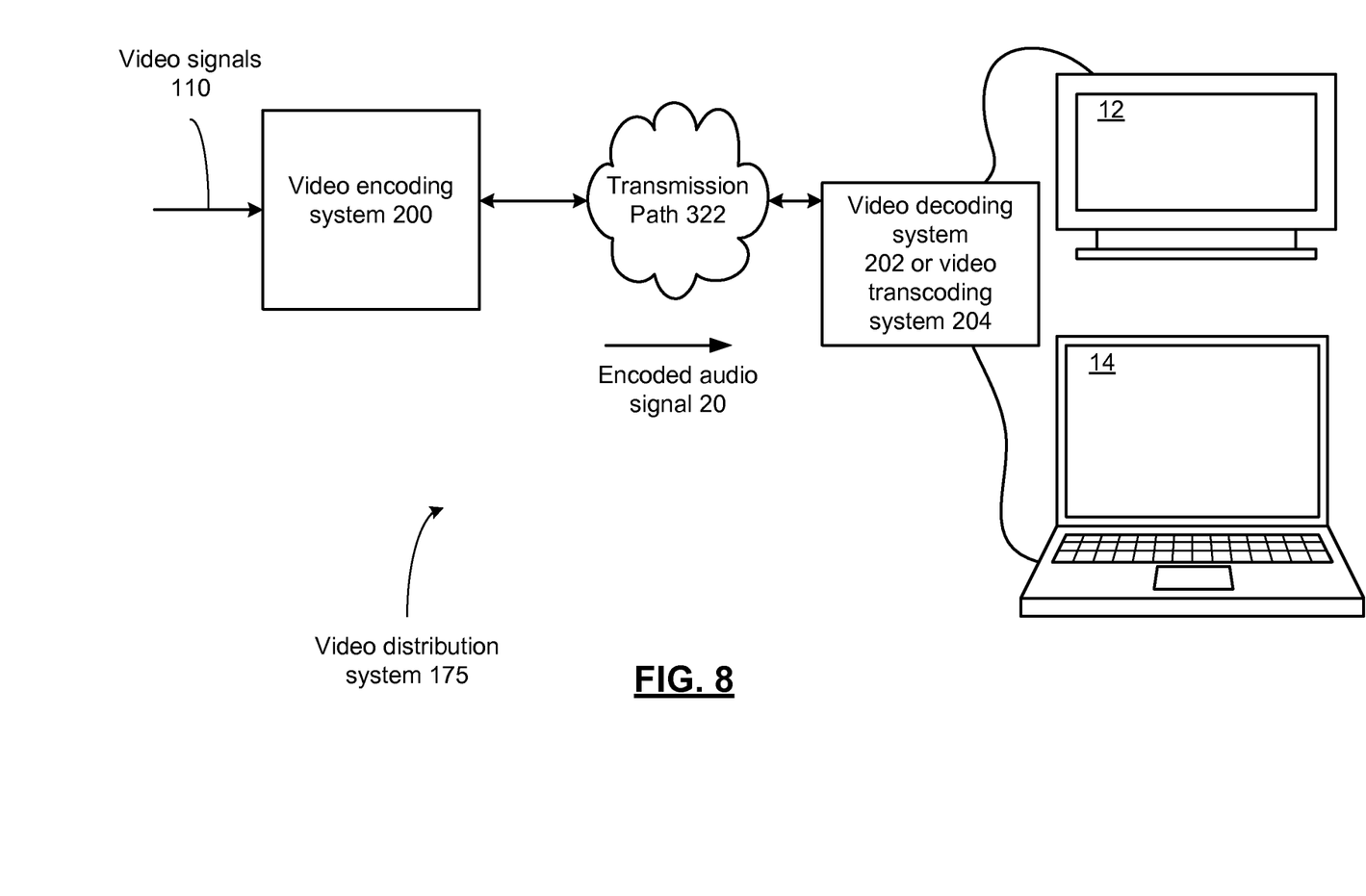
FIG. 8 presents a block diagram representation of a video distribution system 175 in accordance with an embodiment of the present invention.

FIG. 8 presents a block diagram representation of a video distribution system 175 in accordance with an embodiment of the present invention. In particular, processed encoded audio signal 20 is transmitted via a transmission path 322 to a video decoder 202. Video decoding system 202 or video transcoding system 204, in turn can operate to decode or transcode the encoded audio signal 20 for display on a display device such as television 12, computer 14 or other display device.

The transmission path 322 can include a wireless path that operates in accordance with a wireless local area network protocol such as an 802.11 protocol, a WIMAX protocol, a Bluetooth protocol, etc. Further, the transmission path can include a wired path that operates in accordance with a wired protocol such as a USB protocol, high-definition multimedia interface (HDMI) protocol an Ethernet protocol or other high speed protocol.

Figure 9:
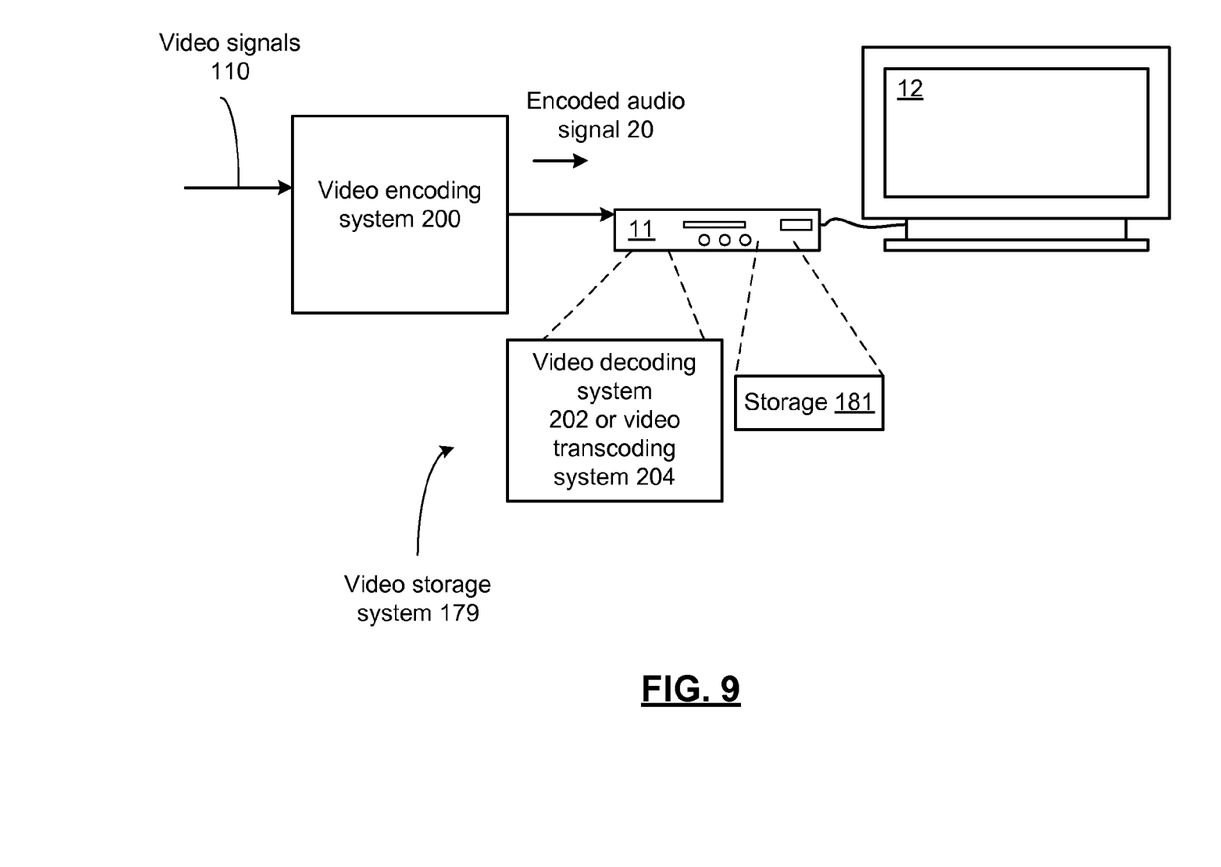
FIG. 9 presents a block diagram representation of a video storage system 179 in accordance with an embodiment of the present invention.

FIG. 9 presents a block diagram representation of a video storage system 179 in accordance with an embodiment of the present invention. In particular, device 11 is a set top box with built-in digital video recorder functionality, a stand alone digital video recorder, a DVD recorder/player or other device that includes video decoding system 202 or video transcoding system 204 and stores the encoded audio signal 20 in storage 181 for playback on a display device such as television 12. Storage 181 can include a hard disk drive optical disk drive or other disk drive, read-only memory, random access memory, volatile memory, non-volatile memory, static memory, dynamic memory, flash memory, cache memory, and/or any device that stores digital information. Storage 181 can be integrated in the device 11 or coupled to the device 11 via a network, wireline coupling or other connection.

While video encoder 200 is shown as a separate device, it can further be incorporated into device 11. While these particular devices are illustrated, video storage system 179 can include a hard drive, flash memory device, computer, DVD burner, or any other device that is capable of generating, storing, decoding and/or displaying a video stream in accordance with the methods and systems described in conjunction with the features and functions of the present invention as described herein.

Figure 10:
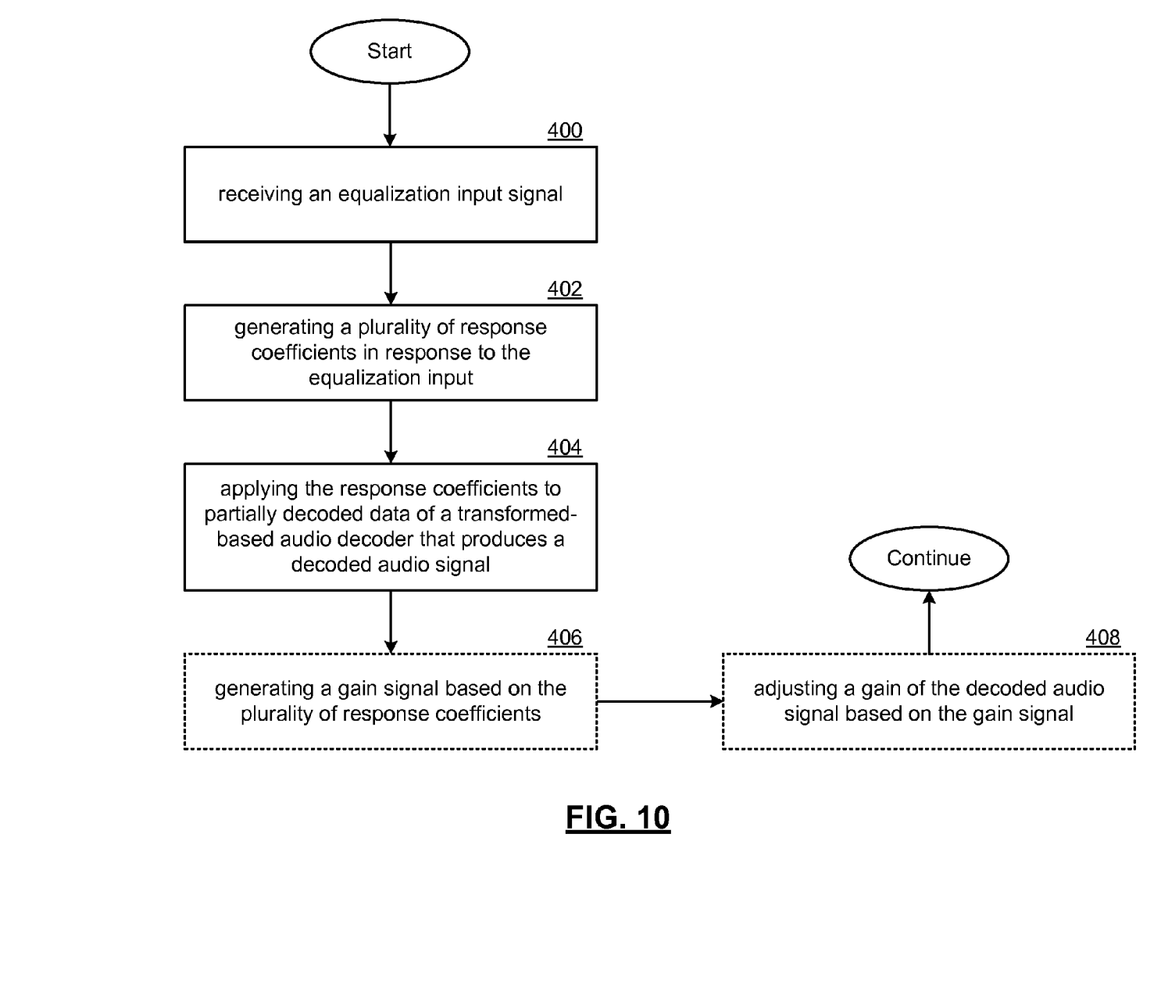
FIG. 10 presents a flowchart representation of a method in accordance with an embodiment of the present invention.

FIG. 10 presents a flowchart representation of a method in accordance with an embodiment of the present invention. In particular a method is presented for use in conjunction with one or more functions and features described in conjunction with FIGS. 1-9. In step 400, an equalization input signal is received. In step 402, a plurality of response coefficients are generated in response to the equalization input. In step 404, the response coefficients are applied to partially decoded data of a transformed-based audio decoder that produces a decoded audio signal. In optional steps 406 and 408, a gain signal is generated based on the plurality of response coefficients and a gain of the decoded audio signal is adjusted based on the gain signal.

In an embodiment of the present invention, the gain signal is generated based on an averaging of at least a subset of the plurality of response coefficients. Step 402 can include generating a plurality of preliminary response coefficients based on the equalization input signal and generating an equalization curve that corresponds to the equalization input signal and fitting the plurality of preliminary response coefficients to the equalization curve. In step 402, the plurality of response coefficients can be generated from the plurality of preliminary response coefficients, based on a window size indicator received from the transform-based audio decoder. Further, in step 402, the plurality of response coefficients can be generated by adjusting the plurality of preliminary response coefficients, when the window size indicator includes a first value. In addition, in step 402, the plurality of response coefficients can be generated as the plurality of response coefficients, when the window size indicator includes a second value. The plurality of preliminary response coefficients can be adjusted by generating a plurality of groups of preliminary response coefficients, and generating each of the plurality of response coefficients based on an averaging of a corresponding one of the plurality of groups of preliminary response coefficients.

While particular combinations of various functions and features of the present invention have been expressly described herein, other combinations of these features and functions are possible that are not limited by the particular examples disclosed herein are expressly incorporated within the scope of the present invention.

As one of ordinary skill in the art will further appreciate, the term "coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "coupled".

As the term module is used in the description of the various embodiments of the present invention, a module includes a functional block that is implemented in hardware, software, and/or firmware that performs one or more functions such as the processing of an input signal to produce an output signal. As used herein, a module may contain submodules that themselves are modules.

Thus, there has been described herein an apparatus and method, as well as several embodiments including a preferred embodiment, for implementing a an audio equalizer. Various embodiments of the present invention herein-described have features that distinguish the present invention from the prior art.

It will be apparent to those skilled in the art that the disclosed invention may be modified in numerous ways and may assume many embodiments other than the preferred forms specifically set out and described above. Accordingly, it is intended by the appended claims to cover all modifications of the invention which fall within the true spirit and scope of the invention.

What is claimed is:

1. An audio equalizer comprising:
   a transform-based audio decoder that produces a decoded audio signal from an encoded audio signal; and
   an equalization processor, coupled to the transform-based audio decoder, that receives an equalization input signal, generates a plurality of response coefficients in response to the equalization input signal and applies the plurality of response coefficients to partially decoded frequency domain data during decoding by the transform-based audio decoder.

2. The audio equalizer of claim 1, wherein the equalization processor further generates a gain signal based on the plurality of response coefficients, and wherein the audio equalizer further comprises:
   a gain stage, coupled to the equalization processor, that adjusts a gain of the decoded audio signal based on the gain signal.

3. The audio equalizer of claim 2, wherein the equalization processor includes a gain generation module that generates the gain signal based on an averaging of at least a subset of the plurality of response coefficients.

4. The audio equalizer of claim 1, wherein the equalization processor includes a response coefficient generator that generates a plurality of preliminary response coefficients based on the equalization input signal.

5. The audio equalizer of claim 4, wherein the response coefficient generator generates an equalization curve that corresponds to the equalization input signal and fits the plurality of preliminary response coefficients to the equalization curve.

6. The audio equalizer of claim 4, wherein the equalization processor further includes a coefficient adjustment module, that generates the plurality of response coefficients from the plurality of preliminary response coefficients, based on a window size indicator received from the transform-based audio decoder.

7. The audio equalizer of claim 6, wherein the coefficient adjustment module adjusts the plurality of preliminary response coefficients when the window size indicator includes a first value.

8. The audio equalizer of claim 7, wherein the coefficient adjustment module uses the plurality of preliminary response coefficients as the plurality of response coefficients when the window size indicator includes a second value.

9. The audio equalizer of claim 7, wherein the coefficient adjustment module adjusts the plurality of preliminary response coefficients by generating a plurality of groups of preliminary response coefficients, and generating each of the plurality of response coefficients based on an averaging of a corresponding one of the plurality of groups of preliminary response coefficients.

10. A method comprising:
receiving an equalization input signal;
generating a plurality of response coefficients in response to the equalization input signal; and
applying the plurality of response coefficients to partially decoded frequency domain data of a transform-based audio decoder that produces a decoded audio signal.

11. The method of claim 10, further comprising:
generating a gain signal based on the plurality of response coefficients; and
adjusting a gain of the decoded audio signal based on the gain signal.

12. The method of claim 11, wherein the gain signal is generated based on an averaging of at least a subset of the plurality of response coefficients.

13. The method of claim 10, wherein generating the plurality of response coefficients includes generating a plurality of preliminary response coefficients based on the equalization input signal.

14. The method of claim 13, wherein generating the plurality of response coefficients includes generating an equalization curve that corresponds to the equalization input signal and fitting the plurality of preliminary response coefficients to the equalization curve.

15. The method of claim 14, wherein the plurality of response coefficients are generated from the plurality of preliminary response coefficients, based on a window size indicator received from the transform-based audio decoder.

16. The method of claim 15, wherein the plurality of response coefficients are generated by adjusting the plurality of preliminary response coefficients, when the window size indicator includes a first value.

17. The method of claim 16, wherein the plurality of response coefficients are generated as the plurality of response coefficients, when the window size indicator includes a second value.

18. The method of claim 16, wherein the plurality of preliminary response coefficients are adjusted by generating a plurality of groups of preliminary response coefficients, and generating each of the plurality of response coefficients based on an averaging of a corresponding one of the plurality of groups of preliminary response coefficients.

* * * * *